US009157977B2

(12) United States Patent
Ohiwa et al.

(10) Patent No.: US 9,157,977 B2
(45) Date of Patent: Oct. 13, 2015

(54) MAGNETIC RESONANCE IMAGING APPARATUS WITH OPTIMAL EXCITATION ANGLE

(75) Inventors: Yoshiharu Ohiwa, Otawara (JP); Kazuya Okamoto, Saitama (JP); Masaaki Umeda, Sakura (JP)

(73) Assignees: KABUSHIKI KAISHA TOSHIBA, Tokyo (JP); TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 295 days.

(21) Appl. No.: 12/914,027

(22) Filed: Oct. 28, 2010

(65) Prior Publication Data

US 2011/0101980 A1   May 5, 2011

(30) Foreign Application Priority Data

Oct. 29, 2009   (JP) .................................. 2009-249410

(51) Int. Cl.
*G01R 33/54* (2006.01)
*G01R 33/483* (2006.01)

(52) U.S. Cl.
CPC ............ *G01R 33/54* (2013.01); *G01R 33/4833* (2013.01); *G01R 33/543* (2013.01)

(58) Field of Classification Search
USPC .......................... 324/300–322; 600/407–435; 382/128–131
See application file for complete search history.

(56) References Cited

U.S. PATENT DOCUMENTS

| | | | | |
|---|---|---|---|---|
| 5,001,428 A | * | 3/1991 | Maier et al. ..................... 324/309 |
| 5,107,215 A | * | 4/1992 | Schaefer et al. ............. 324/314 |
| 5,416,412 A | * | 5/1995 | Slayman et al. .............. 324/309 |
| 6,492,814 B1 | * | 12/2002 | Watkins et al. ................ 324/318 |
| 6,512,373 B1 | * | 1/2003 | Griffin et al. .................. 324/318 |
| 7,053,618 B2 | * | 5/2006 | Zhu .................................. 324/309 |
| 7,075,302 B2 | * | 7/2006 | Zhu .................................. 324/309 |
| 7,078,900 B2 | * | 7/2006 | Vu .................................... 324/314 |
| 7,659,720 B2 | * | 2/2010 | Furudate ........................ 324/318 |
| 7,777,488 B2 | * | 8/2010 | Gore et al. ..................... 324/309 |
| 7,800,368 B2 | * | 9/2010 | Vaughan et al. .............. 324/318 |
| 7,924,007 B2 | * | 4/2011 | Arnold et al. ................. 324/318 |
| 8,111,070 B2 | * | 2/2012 | Adachi et al. ................. 324/309 |
| 8,217,653 B2 | * | 7/2012 | Vaughan ........................ 324/313 |
| 8,228,060 B2 | * | 7/2012 | Busse ............................. 324/307 |
| 8,693,760 B2 | * | 4/2014 | Yokosawa et al. ............ 382/131 |
| 8,781,197 B2 | * | 7/2014 | Wang et al. ................... 382/131 |
| 8,816,688 B2 | * | 8/2014 | Adachi et al. ................. 324/320 |
| 8,825,131 B2 | * | 9/2014 | Peacock et al. ............... 600/410 |
| 2005/0110488 A1 | * | 5/2005 | Zhu .................................. 324/309 |

(Continued)

FOREIGN PATENT DOCUMENTS

| | | |
|---|---|---|
| JP | 3-191947 | 8/1991 |
| JP | 2011-045627 | 3/2011 |

*Primary Examiner* — Melissa Koval
*Assistant Examiner* — Tiffany Fetzner
(74) *Attorney, Agent, or Firm* — Nixon & Vanderhye P.C.

(57) ABSTRACT

According to one embodiment, a magnetic resonance imaging apparatus includes; an imaging area setting unit configured to set an imaging area for a patient according to an imaging condition; an excitation angle determination unit configured to collect magnetic resonance signals from the imaging area by a pre-scan and to determine, on the basis of the collected magnetic resonance signal, an optimal excitation angle of a radio-frequency magnetic field for use in an imaging scan; and an imaging unit configured to acquire imaging data by carrying out the imaging scan of the set imaging area for the patient applying the radio-frequency magnetic field with the determined optimal excitation angle.

14 Claims, 10 Drawing Sheets

(56) References Cited

U.S. PATENT DOCUMENTS

| | | | |
|---|---|---|---|
| 2005/0134268 A1* | 6/2005 | Zhu | 324/309 |
| 2006/0017437 A1* | 1/2006 | Vu | 324/309 |
| 2006/0122496 A1* | 6/2006 | George et al. | 600/424 |
| 2008/0129298 A1* | 6/2008 | Vaughan et al. | 324/322 |
| 2008/0180104 A1* | 7/2008 | Furudate | 324/318 |
| 2008/0211502 A1* | 9/2008 | Arnold et al. | 324/318 |
| 2008/0319301 A1* | 12/2008 | Busse | 600/410 |
| 2009/0021254 A1* | 1/2009 | Gore et al. | 324/309 |
| 2009/0237077 A1* | 9/2009 | Vaughan | 324/307 |
| 2009/0315561 A1* | 12/2009 | Assmann et al. | 324/309 |
| 2009/0322330 A1* | 12/2009 | Adachi et al. | 324/309 |
| 2010/0256480 A1* | 10/2010 | Bottomley et al. | 600/411 |
| 2011/0044524 A1* | 2/2011 | Wang et al. | 382/131 |
| 2011/0101980 A1* | 5/2011 | Ohiwa et al. | 324/309 |
| 2011/0142316 A1* | 6/2011 | Wang et al. | 382/131 |
| 2011/0298459 A1* | 12/2011 | Adachi et al. | 324/318 |
| 2012/0065494 A1* | 3/2012 | Gertner et al. | 600/411 |
| 2012/0093385 A1* | 4/2012 | Yokosawa et al. | 382/131 |
| 2012/0197104 A1* | 8/2012 | Posse et al. | 600/410 |
| 2014/0073907 A1* | 3/2014 | Kumar et al. | 600/414 |
| 2014/0128883 A1* | 5/2014 | Piron et al. | 606/130 |

* cited by examiner

MAGNETIC RESONANCE IMAGING APPARATUS WITH OPTIMAL EXCITATION ANGLE

CROSS-REFERENCE TO RELATED APPLICATIONS

This application is based upon and claims the benefit of priority from Japanese Patent Application No. 2009-249410 filed on Oct. 29, 2009, the entire contents of which are incorporated herein by reference.

TECHNICAL FIELD

Embodiments described herein relate generally to a Magnetic Resonance Imaging apparatus.

RELATED ART

Magnetic resonance imaging is an imaging method which magnetically excites nuclear spins of a patient placed in a static magnetic field with an RF signal at the Larmor frequency to reconstruct an image using an NMR (nuclear magnetic resonance) signal resulting from the excitation.

In magnetic resonance imaging, in order to acquire an image of a patient in an imaging area with maximum sensitivity, it is necessary to adjust a transmit power of an RF signal to be optimal so as to obtain an NMR signal of higher strength from the imaging area. For that, a pulse sequence is executed to excite an axial plane by changing transmit power of the RF signal stepwise using a transmit RF coil capable of generating a uniform RF magnetic field (B1 magnetic field) in the imaging place in which the patient is placed. By utilizing the property that the NMR signal obtained from the axial plane changes with the transmit power of the RF signal, the RF signal transmit power which gives maximum strength to the NMR signal is determined by making a direct or appropriate approximation. That is, the transmit power at which strength of the NMR signal collected from the axial plane becomes maximum is set as power of a 90-degree RF pulse.

Also, a technique has been proposed for determining amplitude and phase of a transmit RF signal based on the patient's size and aspect ratio to correct nonuniformity of the RF magnetic field.

On the other hand, an MRI apparatus with high magnetic field strength has been developed recently. Since frequency of the RF signal is proportional to the magnetic field strength, the frequency of the RF signal increases as a result. For example, the frequency of the RF signal in a magnetic field of 0.5 T is approximately 21 MHz, but becomes approximately 128 MHz in a magnetic field of 3 T. Wavelengths of the RF signal in free space in magnetic fields of 0.5 T and 3 T are approximately 14 m and 2.3 m, respectively. However, in the patient, the wavelength of the RF signal is shortened. If it is assumed that a dielectric constant of a living body is approximately equal to that of water, the wavelengths of the RF signal in the patient in the magnetic fields of 0.5 T and 3 T are 1.7 m and 0.27 m, respectively.

Generally, in order to collect uniform images, a transmit RF coil of an MRI apparatus is designed to be able to generate a uniform RF magnetic field in the imaging place. However, if the patient is placed in a high magnetic field in which the frequency of the RF signal is high, the wavelength of the RF signal is shortened, causing the RF magnetic field in the patient to become nonuniform.

FIG. 1 is a diagram showing an example of an RF magnetic field distribution when the frequency of the transmit RF signal is low and FIG. 2 is a diagram showing an example of an RF magnetic field distribution when the frequency of the transmit RF signal is high.

In FIGS. 1 and 2, the ordinate represents the RF magnetic field B1 while the abscissa represents position x. If a RF magnetic field is generated in a low magnetic field, with the patient placed in the imaging place, using an RF coil capable of generating a uniform RF magnetic field in free space, a uniform RF magnetic field distribution such as shown in FIG. 1 is obtained. This makes it possible to determine optimal transmit power of an RF signal using a conventional adjustment method of an RF signal transmit power.

In contrast, when an RF signal of high frequency is transmitted in a high magnetic field, a nonuniform RF magnetic field distribution such as shown in FIG. 2 is obtained. Consequently, when an imaging plane including an x axis is excited, although it is possible to estimate the RF signal transmit power at which the strength of the NMR signal becomes maximum, it is not clear what position in an x direction the transmit power has been determined to maximize the NMR signal strength at. Also, even if one tries to maximize the NMR signal strength at position x0, it is not possible to estimate optimal transmit power as long as an imaging plane including the x axis is excited selectively. Supposing that a receiver coil is located at position xc, the RF signal transmit power is determined so as to maximize the NMR signal strength at position close to the position xc of the receiver coil rather than at position x0.

That is, when the frequency of the RF signal is high, a B1 distribution in a region to be imaged becomes nonuniform. Therefore, if the conventional method is used to determine the RF signal transmit power, optimal transmit power for a desired imaging region cannot be determined, which will result in degradation of image quality.

Thus, there is demand for a magnetic resonance imaging apparatus which can determine more appropriate RF signal transmit power for a desired imaging region even when frequency of the RF signal becomes high in a high magnetic field.

DETAILED DESCRIPTION

Embodiments of a magnetic resonance imaging apparatus will be described with reference to the accompanying drawings.

According to one embodiment, a magnetic resonance imaging apparatus includes; an imaging area setting unit configured to set an imaging area for a patient according to an imaging condition; an excitation angle determination unit configured to collect magnetic resonance signals from the imaging area by a pre-scan and to determine, on the basis of the collected magnetic resonance signal, an optimal excitation angle of a radio-frequency magnetic field for use in an imaging scan; and an imaging unit configured to acquire imaging data by carrying out the imaging scan of the set imaging area for the patient applying the radio-frequency magnetic field with the determined optimal excitation angle.

(Configuration and Functionality)

Figure 1:
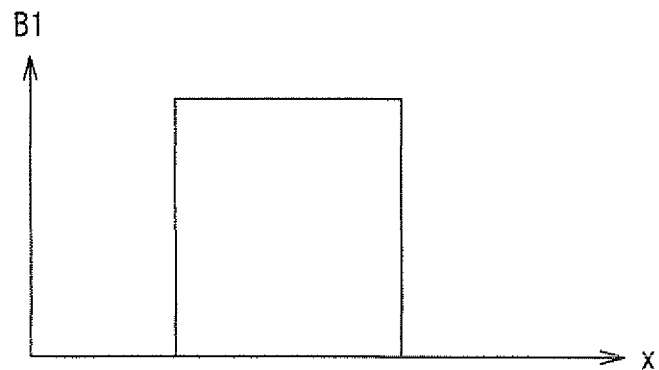
FIG. 1 is a diagram showing an example of an RF magnetic field distribution when frequency of a transmit RF signal is low.
Figure 2:
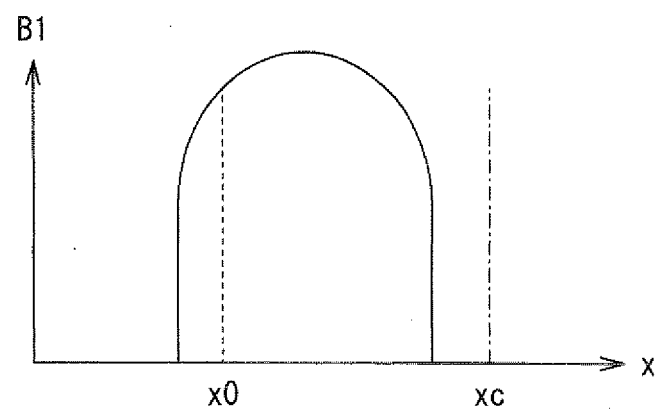
FIG. 2 is a diagram showing an example of an RF magnetic field distribution when the frequency of the transmit RF signal is high.
Figure 3:
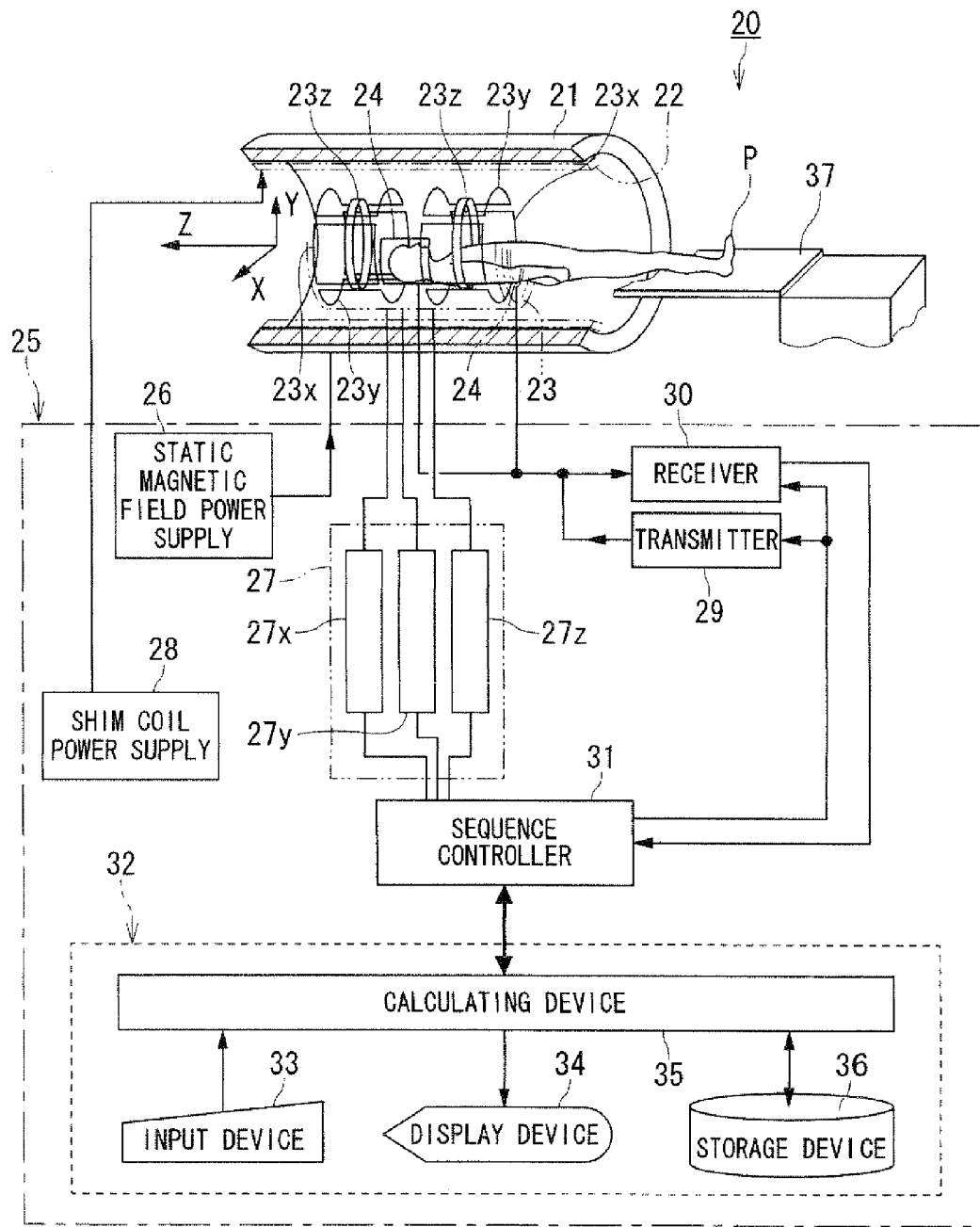
FIG. 3 is a configuration diagram showing a magnetic resonance imaging apparatus according to an embodiment of the present invention.

FIG. 3 is a diagram showing an exemplary configuration of a magnetic resonance imaging apparatus 20 according to the present embodiment.

The magnetic resonance imaging apparatus 20 includes a static magnetic field magnet 21 which is cylindrical in shape and configured to generate a static magnetic field, a shim coil 22 installed in the static magnetic field magnet 21, a gradient coil 23, and RF coils 24.

Also, the magnetic resonance imaging apparatus 20 includes a control system 25. The control system 25 has a static magnetic field power supply 26, a gradient power supply 27, a shim coil power supply 28, a transmitter 29, a receiver 30, a sequence controller 31, and a computer 32. The gradient power supply 27 of the control system 25 includes an X-axis gradient power supply 27x, Y-axis gradient power supply 27y, and Z-axis gradient power supply 27z. Also, the computer 32 is equipped with an input device 33, a display device 34, a calculating device 35, and a storage device 36.

The static magnetic field magnet 21 is connected with the static magnetic field power supply 26 and forms a static magnetic field in an imaging place using an electric current supplied from the static magnetic field power supply 26. The static magnetic field magnet 21 is often made of a superconducting coil and is connected with the static magnetic field power supply 26 during excitation to draw electric current, but generally becomes disconnected once excited. On the other hand, there are cases in which the static magnetic field magnet 21 is made of a permanent magnet without installation of the static magnetic field power supply 26.

The shim coil 22 which is cylindrical in shape is installed concentrically inside the static magnetic field magnet 21. The shim coil 22 is connected with the shim coil power supply 28, supplied with electric current from the shim coil power supply 28, and configured to make the static magnetic field uniform.

The gradient coil 23 is made up of an X-axis gradient coil 23x, Y-axis gradient coil 23y, and Z-axis gradient coil 23z and formed into a cylindrical shape inside the static magnetic field magnet 21. A bed 37 is installed in the gradient coil 23 and used as an imaging place with a patient P placed thereon. The RF coils 24 include a whole body coil (WBC) incorporated in a gantry and used to transmit and receive RF signals, and a local coil installed near the bed 37 or patient P and used to receive RF signals.

The gradient coil 23 is connected with the gradient power supply 27. The X-axis gradient coil 23x, Y-axis gradient coil 23y, and Z-axis gradient coil 23z of the gradient coil 23 are connected, respectively, with the X-axis gradient power supply 27x, Y-axis gradient power supply 27y, and Z-axis gradient power supply 27z of the gradient power supply 27.

A gradient magnetic field Gx in an X-axis direction, gradient magnetic field Gy in a Y-axis direction, and gradient magnetic field Gz in a Z-axis direction are designed to be formed, respectively, in the imaging place by electric currents supplied to the X-axis gradient coil 23x, Y-axis gradient coil 23y, and Z-axis gradient coil 23z, respectively, from the X-axis gradient power supply 27x, Y-axis gradient power supply 27y, and Z-axis gradient power supply 27z.

The RF coils 24 are connected to the transmitter 29 and/or receiver 30. Transmitting RF coils 24 receive an RF signal from the transmitter 29 and transmit the RF signal to the patient P and receiving RF coils 24 receive an NMR signal generated when nuclear spins in the patient P is excited by the RF signal and supply the NMR signal to the receiver 30.

Figure 4:
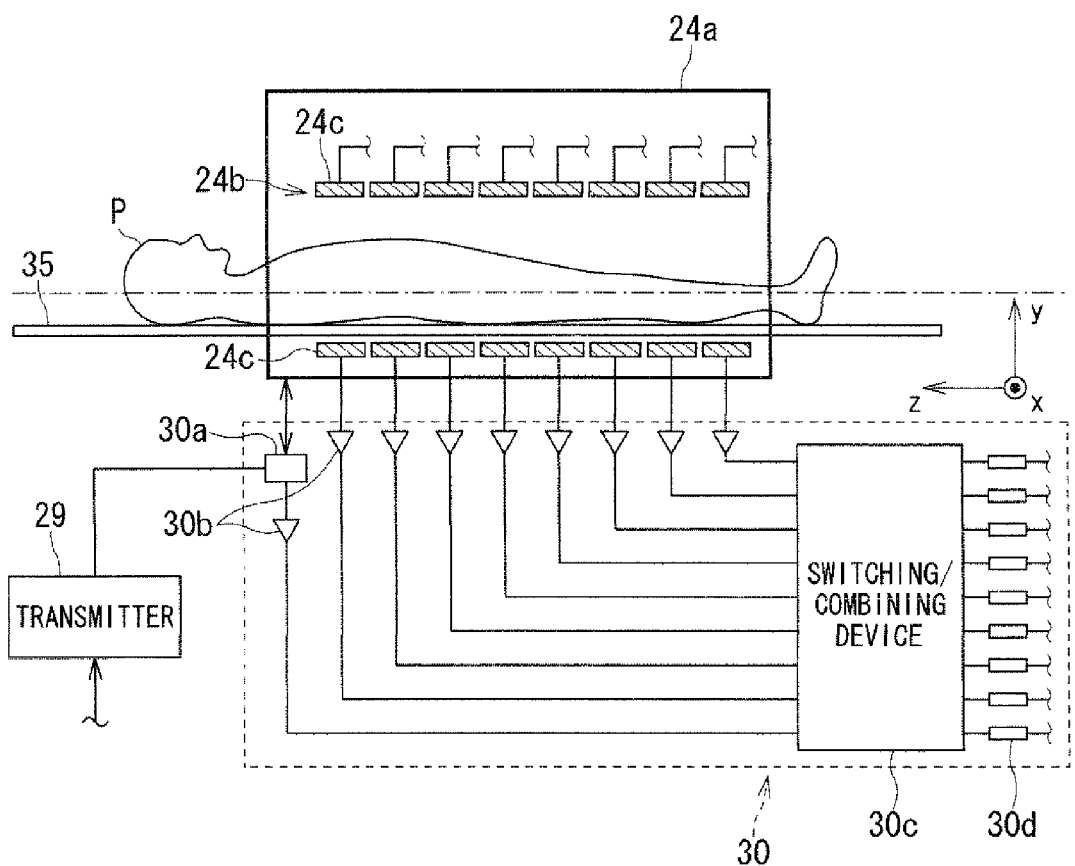
FIG. 4 is a diagram showing an example of detailed configuration of an RF coil shown in FIG. 3.
Figure 5:
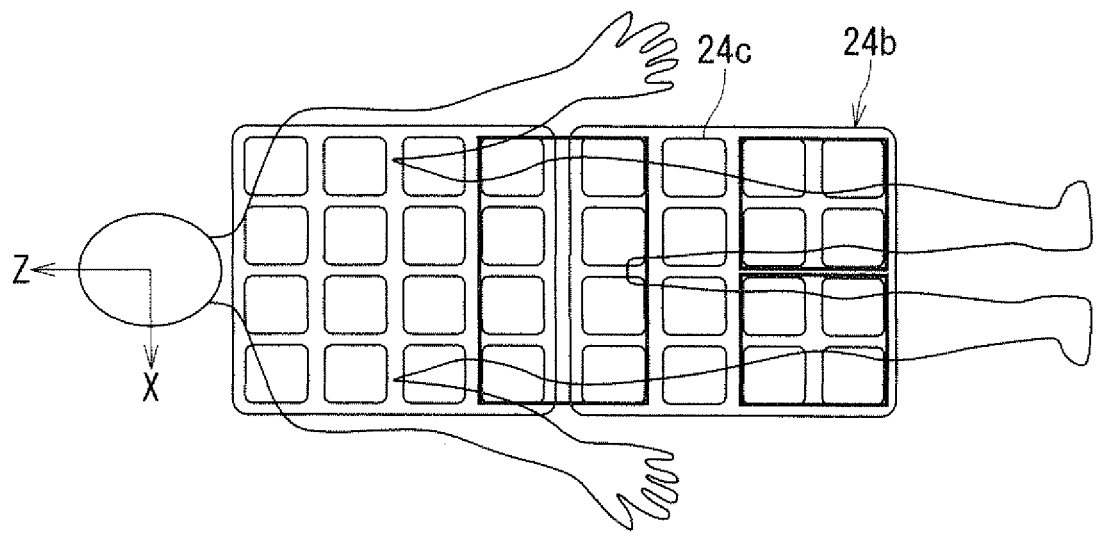
FIG. 5 is a diagram showing an exemplary arrangement of coil elements installed on the front side of a patient shown in FIG. 4.
Figure 6:
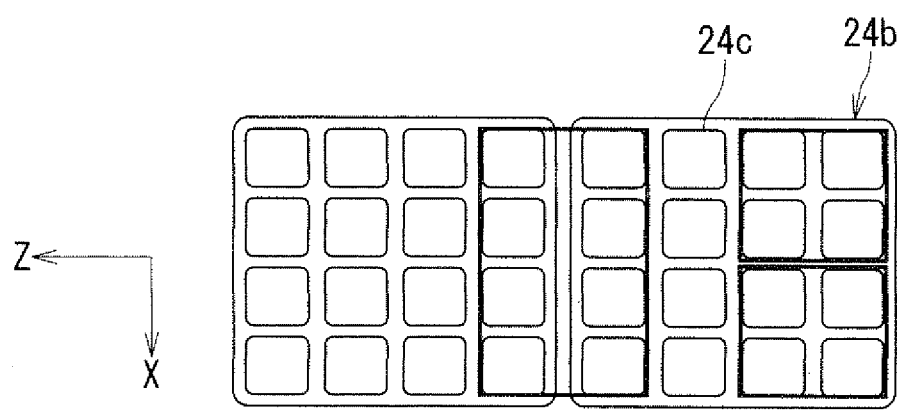
FIG. 6 is a diagram showing an exemplary arrangement of coil elements installed on the back side of the patient shown in FIG. 4.

FIG. 4 is a diagram showing an example of detailed configuration of the RF coils 24 shown in FIG. 3. FIG. 5 is a diagram showing an exemplary arrangement of coil elements 24c installed on the front side of the patient P shown in FIG. 4. FIG. 6 is a diagram showing an exemplary arrangement of coil elements 24c installed on the back side of the patient P shown in FIG. 4.

As shown in FIG. 4, the RF coils 24 include WB (whole-body) coil 24a cylindrical in shape and a phased array coil 24b. The phased array coil 24b includes multiple coil elements 24c, part of which is placed on the front side and the other part of which is placed on the back side of the patient P.

For example, as shown in FIG. 5, four rows of coil elements 24c are placed in an x direction and eight columns of coil elements 24c are placed in a z direction for a total of 32 coil elements 24c on the front side of the patient to cover a wide MRI region. Similarly, as shown in FIG. 6, four rows of coil elements 24c are placed in the x direction and eight columns of coil elements 24c are placed in the z direction for a total of 32 coil elements 24c on the back side of the patient to cover a wide MRI region.

On the other hand, as shown in FIG. 4, the receiver 30 includes a duplexer 30a, amplifiers 30b, one or more switching/combining devices 30c, and receiving-side circuits 30d. The duplexer 30a is connected with the transmitter 29 and WB coils 24a as well as with the amplifiers 30b for the WB coils 24a. There are as many amplifiers 30b as there are coil elements 24c and WB coils 24a, with which the amplifiers 30b are connected individually. There are one or more switching/combining devices 30c. On an input side, the switching/combining devices 30c are connected with the multiple coil elements 24c or WB coils 24a via the multiple amplifiers 30b. A desired number of receiving-side circuits 30d are installed on an output side of the switching/combining devices 30c without exceeding the number of coil elements 24c and the number of WB coils 24a.

The WB coils 24a can be used for transmission of RF signals. On the other hand, the coil elements 24c can be used for reception of the NMR signals. Besides, the WB coils 24a may be used for reception.

The duplexer 30a is configured to supply the WB coils 24a with transmit RF signals outputted from the transmitter 29 and supply the NMR signals received by the WB coils 24a to the switching/combining device 30c via amplifiers 24d in the receiver 30. Also, the NMR signals received by the coil elements 24c are designed to be outputted to the switching/combining device 30c via the respective amplifiers 24d.

The switching/combining device 30c is configured to combine and switch the NMR signals received by the coil elements 24c and WB coils 24a and output the resulting signal to an appropriate receiving-side circuit 30d. In other words, the NMR signals received by the coil elements 24c and WB coils 24a are combined and switched by the switching/combining device 30c according to the number of receiving-side circuits 30d and a sensitivity distribution is created according to an MRI region using desired coil elements 24c so that NMR signals can be received from various MRI regions.

However, the NMR signals may be received by the WB coil 24a alone without installing the coil elements 24c. Also, the NMR signals received by the coil elements 24c or WB coil 24a may be outputted directly to the receiving-side circuits 30d without installing the switching/combining devices 30c. Furthermore, a larger number of coil elements 24c may be placed in a wide range.

On the other hand, the sequence controller 31 of the control system 25 is connected with the gradient power supply 27, transmitter 29, and receiver 30. The sequence controller 31 has a capability to store control information such as sequence information needed to drive the gradient power supply 27, transmitter 29, and receiver 30, where the sequence information describes operational control information such as intensity, application duration, and application timing of a pulsed current to be applied to the gradient power supply 27. The sequence controller 31 also has a capability to drive the gradient power supply 27, transmitter 29, and receiver 30 according to a stored predetermined sequence and thereby generate an X-axis gradient magnetic field Gx, Y-axis gradient magnetic field Gy, Z-axis gradient magnetic field Gz, and RF signal.

The sequence controller 31 is configured to receive raw data and supply the raw data to the computer 32, where the raw data is complex data produced by the receiver 30 through detection and A/D (analog to digital) conversion of NMR signals.

The transmitter 29 supplies an RF signal to the RF coils 24 based on the control information received from the sequence controller 31. On the other hand, the receiver 30 detects the NMR signal received from the RF coils 24, performs required signal processing and A/D conversion, thereby generates raw data which is digitized complex data, and supplies the generated raw data to the sequence controller 31.

The bed 37 is equipped with a bed drive device 39. The bed drive device 39 is connected with the computer 32 and configured to allow imaging to be carried out by moving a table of the bed 37 under the control of the computer 32 using a moving table method or stepping-table method. The moving table method is a technique for providing a large imaging field of view (FOV) in a moving direction by moving the table of the bed 37 continuously during imaging. The stepping-table method is a technique for carrying out 3D (three-dimensional) imaging by moving the table of the bed 37 stepwise on a station-by-station basis. These techniques are used for imaging of a wide region—such as whole-body imaging—which cannot be covered by a single imaging scan. Multiple images collected by moving the bed 37 can be joined together by a combining process carried out by the computer 32.

Various functions of the computer 32 are implemented as the calculating device 35 executes programs stored in the storage device 36 of the computer 32. However, specific circuits with various functions may be installed in the magnetic resonance imaging apparatus 20 without depending on programs.

Figure 7:
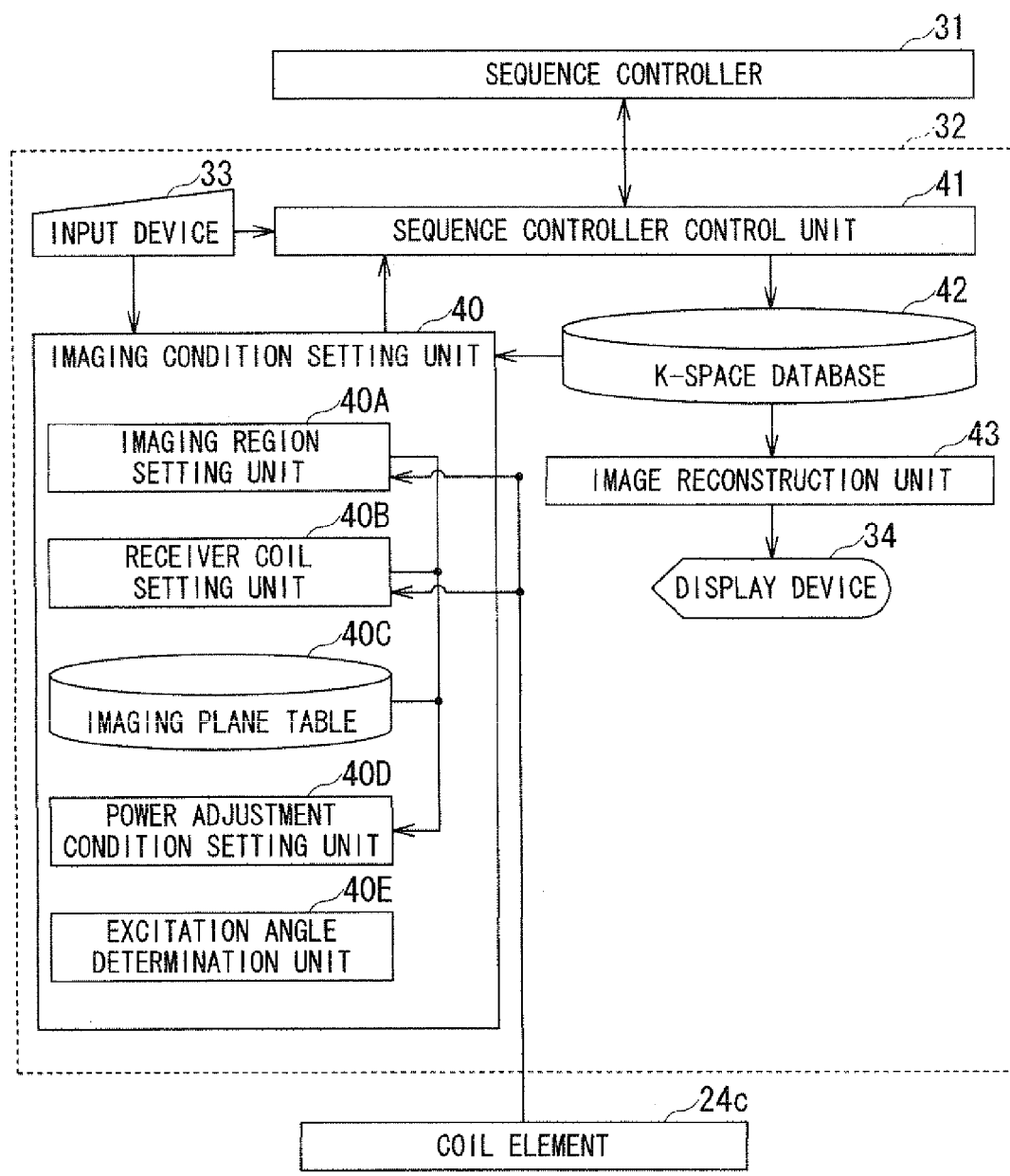
FIG. 7 is a functional block diagram of a computer shown in FIG. 3.

FIG. 7 is a functional block diagram of the computer 32 shown in FIG. 3.

The computer 32 functions as an imaging condition setting unit 40, sequence controller control unit 41, k-space database 42, and image reconstruction unit 43 based on programs. The imaging condition setting unit 40 includes an imaging region setting unit 40A, receiver coil setting unit 40B, imaging plane table 40C, power adjustment condition setting unit 40D, and excitation angle determination unit 40E.

The imaging condition setting unit 40 sets imaging conditions including a pulse sequence based on command information from the input device 33, and supplies the set imaging conditions to the sequence controller control unit 41. In particular, the imaging condition setting unit 40 has a capability to set imaging conditions for a pre-scan used to adjust RF signal transmit power.

The imaging region setting unit 40A has a capability to display candidate imaging regions for an imaging scan on the display device 34 and set the imaging region for the imaging scan as an imaging condition based on region selection information from the input device 33 as well as a capability to set the imaging region associated with receiver coils as an imaging condition when the receiver coils are selected.

The receiver coil setting unit 40B has a capability to display candidates for the coil elements 24c to be used for reception of NMR signals during an imaging scan on the display device 34 and set the coil elements 24c used for reception during the imaging scan, as an imaging condition based on coil selection information from the input device 33 as well as a capability to automatically recognize the coil elements 24c used for reception during the imaging scan according to a predetermined condition and set the recognized coil elements 24c as an imaging condition.

Appropriate imaging planes from which the NMR signals used to adjust RF signal transmit power will be collected are stored in the imaging plane table 40C by being associated with imaging regions and/or coil elements 24c. That is, an appropriate imaging plane is stored in the imaging plane table 40C for each imaging region and/or coil element 24c as an LUT (look up table). Here, an imaging plane corresponds to an imaging area to be imaged for 2D imaging. Thus, for 3D imaging, an imaging area, which is a volume area, includes multiple imaging planes, i.e., multiple imaging slices.

The LUT can be created in advance, based on experience or test imaging, such that the imaging plane will include a center of an RF magnetic field.

The power adjustment condition setting unit 40D has a capability to acquire the imaging plane corresponding to the imaging region and/or coil elements 24c set as an imaging condition from the imaging plane table 40C and set imaging conditions including the pulse sequence used to collect NMR data for adjustment of RF transmit power so that the NMR data will be collected from the acquired imaging plane.

The excitation angle determination unit 40E has a capability to set an excitation angle of an RF excitation pulse for an imaging scan as an imaging condition based on the NMR data for adjustment of RF transmit power collected by a pre-scan.

The sequence controller control unit 41 has a capability to supply imaging conditions including a pulse sequence to the sequence controller 31 and thereby drive and control the sequence controller 31, based on scan start command information from the input device 33. Also, the sequence controller control unit 41 has a capability to receive raw data from the sequence controller 31 and place the raw data in k-space formed in the k-space database 42.

The image reconstruction unit 43 has a capability to capture k-space data from the k-space database 42, apply an image reconstruction process including a Fourier transform (FT) to the k-space data, and thereby reconstruct image data as well as a capability to apply necessary image processing to the image data obtained by the reconstruction and display the resulting image data on the display device 34.

(Operation)

Next, operation of the magnetic resonance imaging apparatus 20 will be described.

Figure 8:
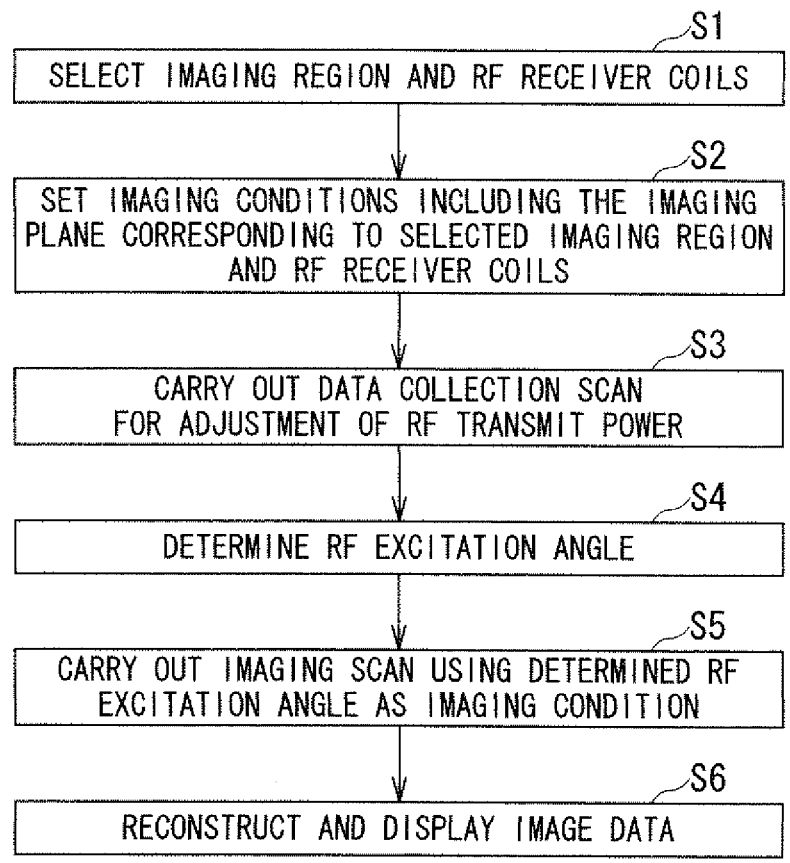
FIG. 8 is a flowchart showing procedures for carrying out imaging, preceded by a pre-scan for adjustment of RF transmit power, on the magnetic resonance imaging apparatus shown in FIG. 3.

FIG. 8 is a flowchart showing procedures for carrying out imaging, preceded by a pre-scan for adjustment of RF transmit power, on the magnetic resonance imaging apparatus 20 shown in FIG. 3.

First, in Step S1, the imaging region to be subjected to an imaging scan is set by the imaging region setting unit 40A and the coil elements 24c to be used as RF receiver coils in the imaging scan are set by the receiver coil setting unit 40B. For example, multiple candidate imaging regions and/or receiver coils are displayed on the display device 34, allowing an operator to select desired ones via the input device 33. Alternatively, when the operator selects an imaging region, receiver coils corresponding to the imaging region may be selected automatically. Conversely, when the operator selects receiver coils, a region from which data can be collected using the selected receiver coils may be set automatically as an imaging region.

On the other hand, instead of allowing receiver coils to be selected via a user interface as described above, the receiver coil setting unit 40B may be configured to automatically recognize the receiver coils selected for data collection, by a known method. For example, a recognition condition may be set such that receiver coils will be recognized automatically when the receiver coil setting unit 40B detects a recognition signal which is generated when coil elements 24c corresponding to a specific imaging region are connected to a connector. Alternatively, a recognition condition may be set such that receiver coils will be recognized automatically when the receiver coil setting unit 40B detects NMR signals from the coil elements 24c corresponding to a specific imaging region. In this case, the imaging region setting unit 40A can automatically recognize the imaging region together with the receiver coils.

Next, in Step S2, imaging conditions for a data collection scan for adjustment of RF transmit power are set including the imaging plane corresponding to the set imaging region and/or receiver coils. That is, the power adjustment condition setting unit 40D acquires the imaging plane corresponding to the imaging region and/or receiver coils from the imaging plane table 40C and sets the acquired imaging plane as an imaging condition for the data collection scan for adjustment of RF transmit power.

Figure 9:
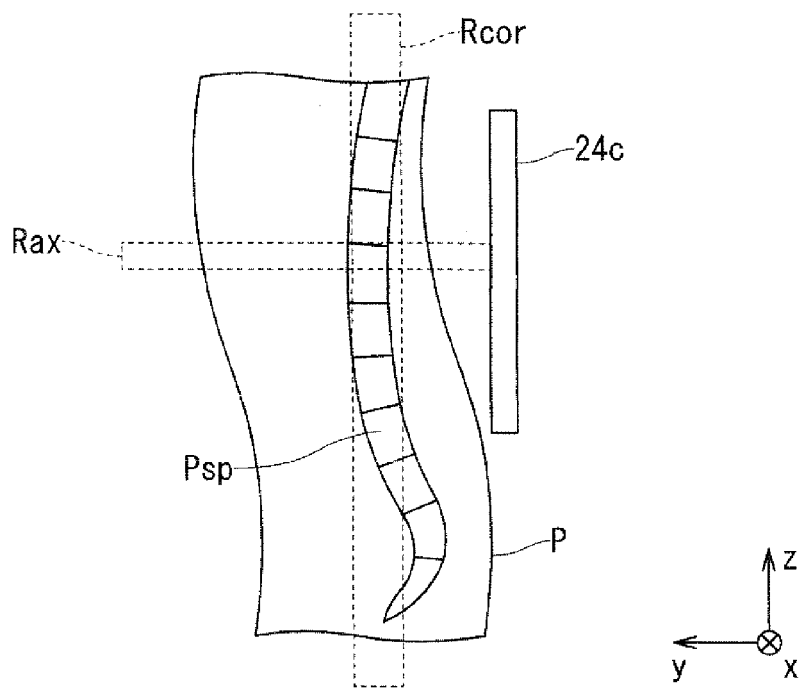
FIG. 9 is a diagram showing an example of how an imaging plane corresponding to an imaging region and receiver coils is determined on the magnetic resonance imaging apparatus shown in FIG. 3.

FIG. 9 is a diagram showing an example of how an imaging plane corresponding to an imaging region and receiver coils is established on the magnetic resonance imaging apparatus 20 shown in FIG. 3.

As shown in FIG. 9, when the spinal column Psp in the patient P is selected as an imaging region, a coronal plane Rcor estimated in advance so as to include the center of the RF magnetic field and run along the spinal column Psp is automatically determined as an imaging plane from the imaging plane table 40C.

On the other hand, when the abdominal region is selected as an imaging region, a coronal plane Rcor or axial plane Rax estimated so as to include the abdominal region becomes a major candidate for an imaging plane. In this case, if the coil elements 24c placed at the back of the patient P are further selected as receiver coils, the coronal plane Poor is determined, from the imaging plane table 40C, as an imaging plane suitable for imaging the abdominal region.

Note that, in the example of FIG. 9, an xy plane is set as an axial plane and an xz plane is set as a coronal plane.

Figure 10:
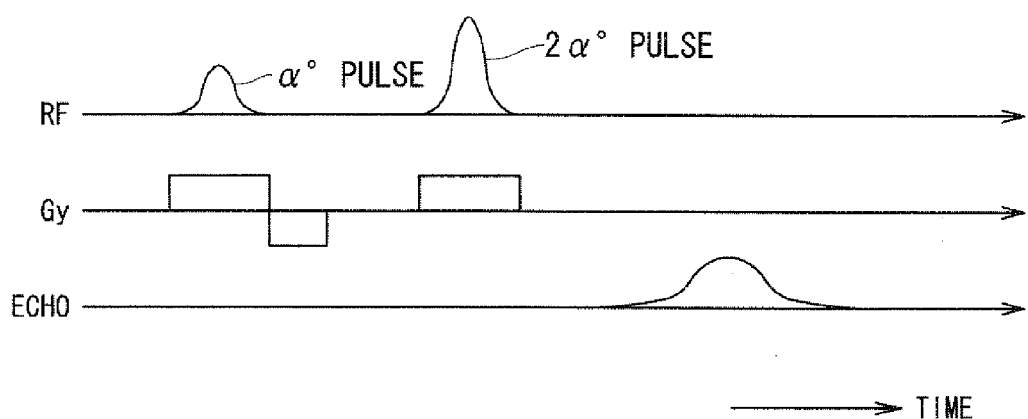
FIG. 10 is a diagram showing an exemplary pulse sequence of a data collection scan for adjustment of the RF transmit power used to excite the imaging plane determined as shown in FIG. 9.

FIG. 10 is a diagram showing an exemplary pulse sequence of a data collection scan, i.e., a pre-scan, for adjustment of the RF transmit power used to excite the imaging plane established as shown in FIG. 9.

In FIG. 10, the abscissa represents time, "RF" represents a transmitted RF pulse, "Gy" represents a gradient pulse in a y direction, and "ECHO" represents an NMR echo signal. Since the coronal plane Rcor in FIG. 9 is a slice in the y direction, the slice is selected by the gradient magnetic field Gy in the y direction as shown in FIG. 10. Then, with the slice in the y direction selected, a pulse sequence made up of a pair of pulses—an $\alpha°$ pulse and $2\alpha°$ pulse—to be applied is set as an imaging condition. Furthermore, different values of $\alpha$ are set. For example, $\alpha$ is set to multiple values by being changed in predetermined increments from a possible lower limit to upper limit. The $\alpha°$ pulse and $2\alpha°$ pulse making up the pulse sequence shown in FIG. 10 as an example correspond to an excitation pulse and refocusing pulse of a spin echo pulse sequence, where $\alpha°$ correspond to an excitation angle. Pulse sequences are not limited to spin echo pulse sequences. For example, when a gradient echo pulse sequence is used for an imaging scan, the excitation angle of an excitation pulse ($\alpha°$ pulse) is changed in predetermined increments.

Although a single-slice selective excitation pulse sequence is shown in FIG. 10, a multi-slice selective excitation pulse sequence may be used for a data collection scan for adjustment of RF transmit power. The use of a single-slice selective excitation pulse sequence allows the RF transmit power to be adjusted with higher accuracy when B1 is highly nonuniform. On the other hand, the multi-slice selective excitation allows different $\alpha°$ pulses to be applied simultaneously to different slices. This makes it possible to reduce scan time.

Next, in Step S3, a pre-scan is carried out as a data collection scan for adjustment of RF transmit power according to the imaging conditions set by the power adjustment condition setting unit 40D. That is, the data collection scan for adjustment of RF transmit power is carried out to collect data by selectively exciting the imaging plane which has been set according to the imaging region and/or receiver coils and gradually changing the excitation angle of the RF excitation pulse.

To begin with, the patient P is placed on the bed 37 in advance and a static magnetic field is formed in an imaging place of the static magnetic field magnet 21 (superconducting magnet) excited by the static magnetic field power supply 26. Also, an electric current is supplied to the shim coil 22 from the shim coil power supply 28, and consequently the static magnetic field formed in the imaging place is made uniform.

Then, as a pre-scan start command is given to the sequence controller control unit 41 from the input device 33, the sequence controller control unit 41 supplies imaging conditions including a pulse sequence acquired from the imaging condition setting unit 40 to the sequence controller 31. Based on the pulse sequence received from the sequence controller control unit 41, the sequence controller 31 drives the gradient power supply 27, transmitter 29, and receiver 30, causing a gradient magnetic field to be formed in the imaging place in which the patient P is placed, and an RF signal to be generated from the RF coil 24.

An NMR signal generated by nuclear magnetic resonance in the patient P is received by the RF coil 24 and supplied to the receiver 30. Upon receiving the NMR signal from the RF coil 24, the receiver 30 performs required signal processing, and then generates raw data by converting the NMR signal into digital data. The receiver 30 supplies the generated raw data to the sequence controller 31. The sequence controller 31 supplies the raw data to the sequence controller control unit 41, which then places the raw data as k-space data in the k-space formed in the k-space database 42.

Next, in Step S4, the optimal excitation angle of the RF excitation pulse to be used in the imaging scan is determined based on the k-space data collected by the data collection scan for adjustment of RF transmit power. That is, the excitation angle determination unit 40E extracts k-space data which maximizes signal strength from the k-space data for different excitation angles collected by the data collection scan for adjustment of RF transmit power. Then, the RF pulse excitation angle corresponding to the extracted k-space data is set as the excitation angle for the imaging scan.

The excitation angle which maximizes the signal strength can be determined, for example, by an approximation method used commonly. Concrete examples include a method which collects k-space data by changing the excitation angle until a signal strength of the k-space data falls below a maximum value, fits the signal strength to a quadratic function, and thereby calculates the RF pulse excitation angle corresponding to the transmit power which maximizes the signal strength.

Next, in Step S5, an imaging scan is carried out using the set excitation angle of the RF excitation pulse as an imaging condition.

Next, in Step S6, image data is reconstructed from the k-space data collected by the imaging scan. Necessary image processing is applied to the reconstructed image data and the image data subjected to the image processing is displayed on the display device 34.

The magnetic resonance imaging apparatus 20 can set an appropriate imaging area (imaging plane) for the data collection scan for adjustment of RF transmit power according to imaging conditions including an imaging region such as the spinal column or abdominal region and the type of receiver coil corresponding to a placement location. Also, depending on imaging conditions, the magnetic resonance imaging apparatus 20 can use not only an axial plane, but also an imaging plane (coronal plane or sagittal plane) other than an axial plane, for the data collection scan for adjustment of RF transmit power.

Thus, the magnetic resonance imaging apparatus 20 can collect data for adjustment of RF transmit power by selectively exciting not only an axial plane, as is conventionally the case, but also a coronal plane, sagittal plane, or oblique plane other than an axial plane. This makes it possible to determine optimal RF transmit power for an appropriate imaging plane according to imaging conditions such as the imaging region and receiver coils, ensuring high image quality even when resonant frequency of the NMR signal becomes high due to high magnetic field strength.

(Variations)
(First Variation)

Although in the example shown in FIG. 9, an imaging region in the patient P is set individually and concretely, such as the spinal column or abdominal region, the imaging region may be set more generally. For example, a pilot image for positioning (i.e., a positioning image) may be acquired beforehand in order to set the imaging region, and then the imaging region for the data collection scan for adjustment of RF transmit power may be set as a region of interest (ROI) with reference to the pilot images which represent shape of the patient P. In that case, an imaging plane may be determined based on region specification information from the input device 33 without reference to the imaging plane table 40C. Alternatively, an imaging plane which has been determined with reference to the imaging plane table 40C may be adjusted via the input device 33.

In that case, the power adjustment condition setting unit 40D is configured to determine an imaging plane based on region setting information from the input device 33 and set imaging conditions including a pulse sequence for NMR data collection for adjustment of RF transmit power so as to collect NMR data from the set imaging plane.

Figure 11:
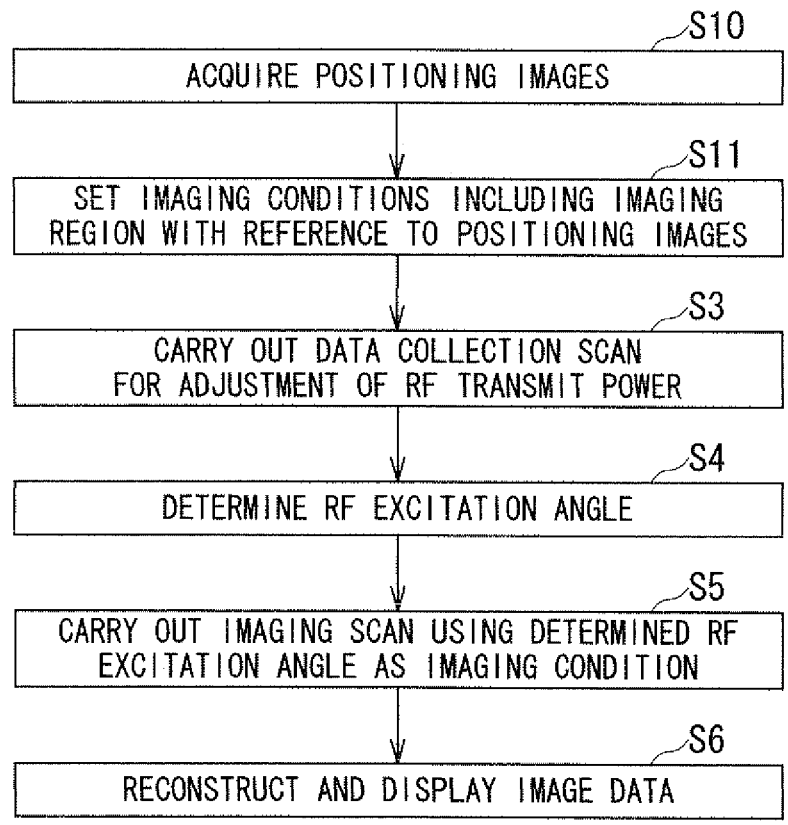
FIG. 11 is a flowchart showing procedures for acquiring a positioning image and determining an imaging plane for a data collection scan for adjustment of RF transmit power with reference to the positioning image, on the magnetic resonance imaging apparatus shown in FIG. 3.

FIG. 11 is a flowchart showing procedures for acquiring a positioning image and determining an imaging plane for a data collection scan for adjustment of RF transmit power with reference to the positioning images, on the magnetic resonance imaging apparatus 20 shown in FIG. 3. Incidentally, in FIG. 11, the same steps as those in FIG. 8 are denoted by the same step numbers as the corresponding steps in FIG. 8, and description thereof will be omitted.

In Step S10 in FIG. 11, imaging conditions for positioning-image acquisition are set by the imaging region setting unit 40A and a positioning-image acquisition scan is carried out. Next, in Step S11, the acquired positioning images are displayed on the display device 34, and then an imaging plane for a data collection scan for adjustment of the RF transmit power is determined based on the positioning images.

Figure 12:
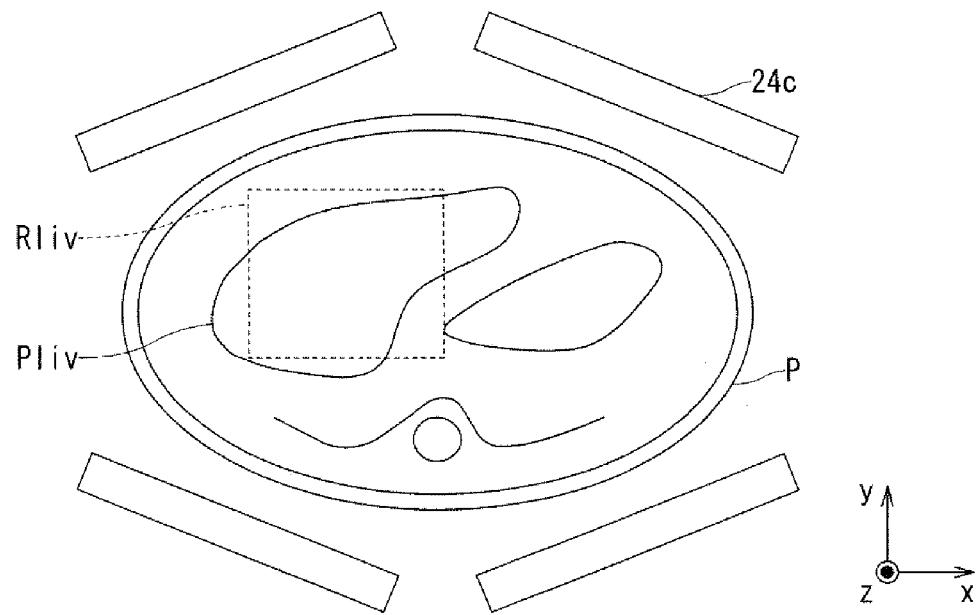
FIG. 12 is a diagram showing an example of how an imaging area corresponding to an imaging region and receiver coils is determined using a positioning image on the magnetic resonance imaging apparatus shown in FIG. 3.

FIG. 12 is a diagram showing an example of how an imaging area corresponding to an imaging region and receiver coils is determined using a positioning image on the magnetic resonance imaging apparatus 20 shown in FIG. 3.

As shown in FIG. 12, an axial plane image of the abdominal region including the liver Pliv of the patient P can be acquired as a positioning image. If such a positioning image is acquired, a more accurate three-dimensional area Rliv including the liver Pliv can be set as an imaging area for a data collection scan for adjustment of RF transmit power. Also, coil elements 24c suitable for imaging of the liver Pliv are selected as receiver coils.

Figure 13:
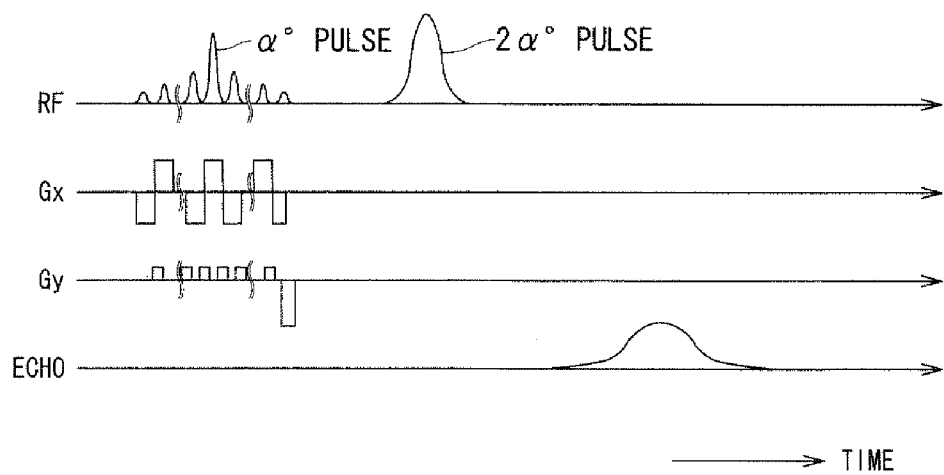
FIG. 13 is a diagram showing an exemplary pulse sequence of a data collection scan for adjustment of the RF transmit power used to excite the imaging area established as a three-dimensional area, as shown in FIG. 12.

FIG. 13 is a diagram showing an exemplary pulse sequence of a data collection scan for adjustment of the RF transmit power used to excite the imaging area established as a three-dimensional area, as shown in FIG. 12.

In FIG. 13, the abscissa represents time, RF represents a transmitted RF pulse, Gx represents a gradient pulse in the x direction, Gy represents a gradient pulse in the y direction, and ECHO represents an NMR echo signal. The three-dimensional area Rliv in FIG. 12 is a slab region which has thicknesses in the x direction and y direction, and thus a three-dimensional area is selected by gradient magnetic fields Gx and Gy in the x and y directions as shown in FIG. 13. Then, with the three-dimensional area which has thicknesses in two axial directions being excited selectively, a two-dimensional excitation pulse sequence made up of an $\alpha°$ pulse and $2\alpha°$ pulse to be applied is set as an imaging condition.

Incidentally, although in FIG. 13, a $2\alpha°$ pulse is applied with no region selected, a gradient pulse Gz in the z direction may be applied simultaneously with the $2\alpha°$ pulse. In this case, a three-dimensional excitation pulse sequence is set as an imaging condition to selectively excite a three-dimensional area which has thicknesses in three axial directions including the z direction in addition to the x and y directions.

Also, three-dimensional area, such as shown in FIG. 12, which has thicknesses in two or three axial directions may be stored in the imaging plane table 40C by being associated with an imaging region or receiver coils.

(Second Variation)

Normally, when the patient P is placed in the static magnetic field magnet 21 by moving the table 37A of the bed 37, the imaging region of the patient P is positioned so as to be placed in center part of the imaging area formed in the static magnetic field magnet 21. Thus, the imaging region can be recognized automatically using positioning information about the table 37A.

Figure 14:
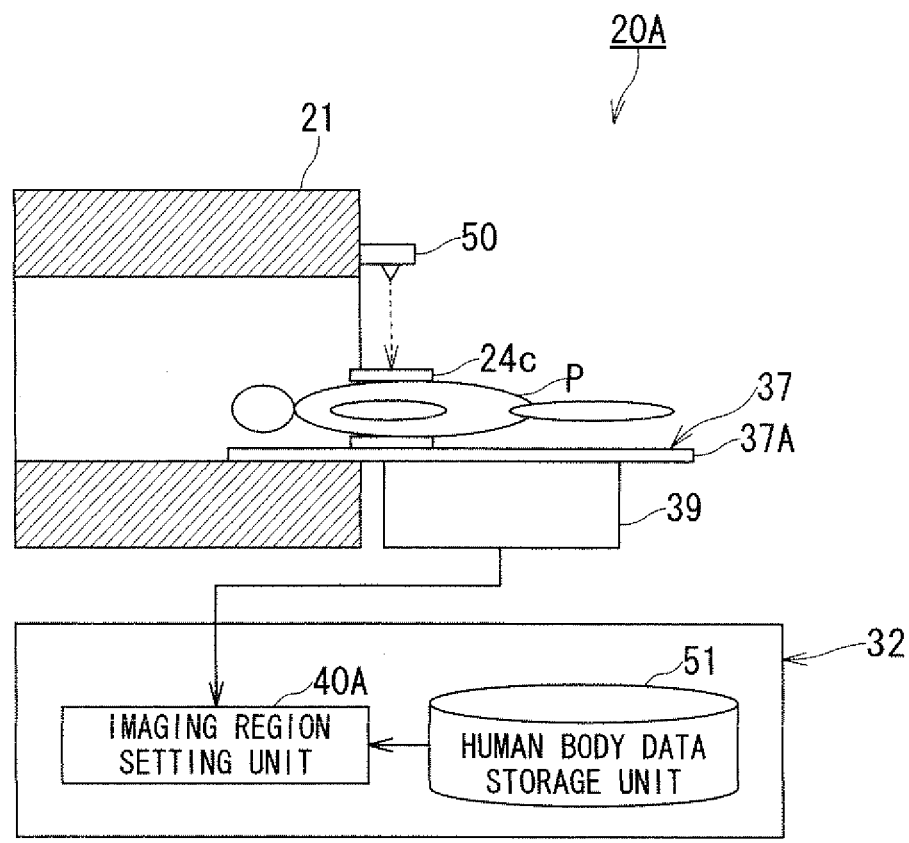
FIG. 14 is a diagram showing an exemplary configuration of a magnetic resonance imaging apparatus equipped with a laser pointer device for positioning of a patient P.

FIG. 14 is a diagram showing an exemplary configuration of a magnetic resonance imaging apparatus 20A equipped with a laser pointer device for positioning of the patient P.

As shown in FIG. 14, the magnetic resonance imaging apparatus 20A is equipped with a laser pointer device 50. The laser pointer device 50 is installed in such a position as to be able to irradiate the patient P placed on the table 37A outside the imaging place with laser. The laser pointer device 50 is configured to mark an imaging region by irradiating the patient P with laser. Also, information about laser irradiation position of the laser pointer device 50 and position of the table 37A is outputted to the bed drive device 39.

The bed drive device 39 is configured to move the table 37A, when a patient insertion button is pressed, so that the patient's (P) imaging region marked by the laser pointer device 50 will be placed in center part of the static magnetic field magnet 21. Also, the bed drive device 39 is configured to output position control information for the table 37A, including information about the position marked by the laser pointer device 50, to the imaging region setting unit 40A.

On the other hand, the computer 32 includes a human body data storage unit 51 which stores human body data by associating positions of imaging regions with shape of a human body.

This allows the imaging region setting unit 40A to identify a given imaging region based on position information about the imaging region specified relative to the patient P and table 37A as well as on the human body data. That is, the imaging of the patient P, if carried out by moving the table 37A, provides image data of the patient P in such a way as to allow comparison with the human body data. For example, when sagittal image data of the patient P is collected, by comparing the position of the imaging region on the sagittal image data with the human body data of the sagittal image, it is possible to automatically determine the position of the imaging region on the human body.

Thus, the imaging region setting unit 40A can automatically recognize the imaging region without being directed to do so via a user interface. Consequently, the imaging plane for a data collection scan for adjustment of RF transmit power can be set automatically together with the receiver coils associated with the imaging region recognized automatically.

While certain embodiments have been described, these embodiments have been presented by way of example only, and are not intended to limit the scope of the invention. Indeed, the novel apparatuses and units described herein may be embodied in a variety of other forms; furthermore, various omissions, substitutions and changes in the form of the apparatuses and units described herein may be made without departing from the spirit of the invention. The accompanying claims and their equivalents are intended to cover such forms or modifications as would fall within the scope and spirit of the invention.

What is claimed is:

1. A magnetic resonance imaging (MRI) apparatus comprising: MRI system having a static magnetic field generator establishing a static magnetic field strength which is high enough to cause magnetic resonance radio frequency (RF) wavelengths that are short enough to result in substantially non-uniform MRI RF fields across an anatomical portion of a patient to be imaged in an MRI system imaging volume;

said MRI system also having components including gradient magnetic field generators, at least one RF transmit coil coupled to said imaging volume, a plurality of types of RF receiver coils also coupled to at least a portion of said imaging volume, RF transmit and RF receive circuits coupled to said RF coils, and at least one control computer having an operator input device and a display, said at least one control computer being connected to control said MRI system components and programmed to:

set an imaging plane, which is to be subsequently imaged during a magnetic resonance (MR) imaging scan of a patient, and also to be used in a patient pre-scan, the imaging plane being set based on a specified anatomical portion of the patient inputted via the operator input device, which defines a positioning image on the display, said specified anatomical portion of the patient being subjected to said substantially non-uniform MRI RF fields;

automatically select a specific type of RF receiver coil from among the plurality of RF receiver coils that corresponds to the set imaging plane;

collect magnetic resonance signals from the set imaging plane during the pre-scan using the automatically selected specific type of RF receiver coil and determine, on the basis of the collected magnetic resonance signals, an optimal excitation nutation angle of an RF magnetic field for use in a subsequent magnetic resonance (MR) imaging scan of the operator-specified anatomical portion of the patient; and acquire MRI data during a magnetic resonance (MR) imaging scan of the operator-set imaging plane of the patient using the automatically selected specific type of RF receiver coil and an RF excitation magnetic field with the determined optimal excitation nutation angle, with the acquired MRI data also being displayable as an MR image on the display.

2. The magnetic resonance imaging apparatus according to claim 1, wherein the imaging plane is set on a displayed positioning image.

3. The magnetic resonance imaging apparatus according to claim 1, wherein a three-dimensional imaging volume which has thicknesses in at least two axial directions is set on a displayed positioning image.

4. The magnetic resonance imaging apparatus according to claim 1, wherein the specific type of receiver coil used for the imaging is automatically recognized and selected based on a connection state of the receiver coil, and the imaging plane is set according to the recognized receiver coil.

5. The magnetic resonance imaging apparatus according to claim 1, wherein the imaging plane is set based upon the specific anatomical portion of the patient being automatically recognized based on pre-stored human body data and patient positioning information obtained from the anatomical portion of the patient within the MRI system.

6. The magnetic resonance imaging apparatus according to claim 1, wherein the set imaging plane is selected using pre-stored data relating image plane positions including a center of an RF magnetic field to at least one of (a) respectively corresponding specific anatomical patient portions, and (b) specific types of receiver coils.

7. The magnetic resonance imaging apparatus according to claim 6, wherein said pre-stored data comprises a look-up table stored in a data memory of the magnetic resonance imaging apparatus.

8. A magnetic resonance imaging (MRI) apparatus comprising:
an MRI system having a static magnetic field generator establishing a static magnetic field strength which is high enough to cause magnetic resonance radio frequency (RF) wavelengths that are short enough to result in substantially non-uniform MRI RF fields across an anatomical portion of a patient to be imaged in an MRI system imaging volume,
said MRI system also having components including gradient magnetic field generators, at least one RF transmit coil coupled to said imaging volume, a plurality of types of receiver coils also coupled to at least a portion of said imaging volume, RF transmit and RF receive circuits coupled to said RF coils, and at least one controlling computer having an operator input device and a display, said at least one control computer being connected to control said MRI system components and programmed to:
set an imaging plane, which is to be subsequently imaged during a magnetic resonance (MR) imaging scan of a patient, and also to be used in a patient pre-scan, the imaging plane being set based on a specified anatomical portion of the patient, inputted via the operator input device which defines a positioning image on the display, said specified anatomical portion of the patient being subjected to said substantially non-uniform MRI RF fields;
automatically select a specific type of RF receiver coil among the plurality of types of RF receiver coils that corresponds to the set imaging plane;
collect magnetic resonance signals from the set imaging plane during the pre-scan using the automatically selected specific type of RF receiver coil and determine, on the basis of the collected magnetic resonance signals, an optimal excitation nutation angle of an RF magnetic field for use in a subsequent magnetic resonance (MR) imaging scan of the operator-specified anatomical portion of the patient; and
acquire MRI data during a magnetic resonance (MR) imaging scan of the operator-set imaging plane of the patient using the automatically selected specific type of RF receiver coil and an RF excitation magnetic field with the determined optimal excitation nutation angle, with the acquired MRI data also being displayable as an MR image on the display.

9. The magnetic resonance imaging apparatus according to claim 8, wherein the imaging plane is set on a displayed positioning image.

10. The magnetic resonance imaging apparatus according to claim 8, wherein the imaging plane is set as a three-dimensional imaging volume which has thicknesses in at least two axial directions, and is set on a displayed positioning image.

11. The magnetic resonance imaging apparatus according to claim 8, wherein the specific type of receiver coil used for the MR imaging is automatically recognized based on a connection state of the receiver coil, and the imaging plane is set according to the recognized receiver coil.

12. The magnetic resonance imaging apparatus according to claim 8, wherein the imaging plane is set depending upon the specific anatomical portion of the patient automatically recognized based on pre-stored human body data and patient positioning information obtained from the anatomical portion of the patient within the MRI system.

13. The magnetic resonance imaging apparatus according to claim 8, wherein the set imaging plane is selected using pre-stored data relating image plane positions including a center of an RF magnetic field to at least one of (a) respectively corresponding specific anatomical patient portions, and (b) specific types of receiver coils.

14. The magnetic resonance imaging apparatus according to claim 13, wherein said pre-stored data comprises a look-up table stored in a data memory of the magnetic resonance imaging apparatus.

* * * * *